(12) United States Patent
Horng et al.

(10) Patent No.: US 11,360,189 B2
(45) Date of Patent: Jun. 14, 2022

(54) PHASE-TRACKING SELF-INJECTION-LOCKED RADAR

(71) Applicant: NATIONAL SUN YAT-SEN UNIVERSITY, Kaohsiung (TW)

(72) Inventors: Tzyy-Sheng Horng, Kaohsiung (TW); Shiang-Hwua Yu, Kaohsiung (TW); Kang-Chun Peng, Kaohsiung (TW); Wei-Chih Su, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 92 days.

(21) Appl. No.: 17/106,315

(22) Filed: Nov. 30, 2020

(65) Prior Publication Data
US 2022/0128651 A1    Apr. 28, 2022

(30) Foreign Application Priority Data
Oct. 22, 2020 (TW) .................................. 109136758

(51) Int. Cl.
*G01S 7/35* (2006.01)
*H03L 7/08* (2006.01)
*G01S 13/50* (2006.01)

(52) U.S. Cl.
CPC .............. *G01S 7/352* (2013.01); *H03L 7/08* (2013.01); *G01S 13/50* (2013.01)

(58) Field of Classification Search
CPC ............ G01S 7/352; G01S 13/50; H03L 7/08
See application file for complete search history.

(56) References Cited

U.S. PATENT DOCUMENTS

| 9,603,555 B2* | 3/2017 | Horng ................. A61B 5/0816 |
| 10,763,872 B1* | 9/2020 | Wang ..................... G01S 13/88 |

(Continued)

FOREIGN PATENT DOCUMENTS

CN            111289966 A        6/2020

OTHER PUBLICATIONS

Taiwanese Office Action dated May 6, 2021 for Taiwanese Patent Application No. 109136758, 7 pages.
(Continued)

*Primary Examiner* — Adam D Houston
(74) *Attorney, Agent, or Firm* — Demian K. Jackson; Jackson IPG PLLC

(57) ABSTRACT

A phase-tracking self-injection-locked (SIL) radar includes an SIL oscillator, a phase-tracking SIL loop and a frequency-locked loop. The SIL oscillator generates an electrical oscillation signal and receives an electrical injection signal related to the electrical oscillation signal for self-injection locking. The phase-tracking SIL loop receives the electrical oscillation signal and outputs the electrical injection signal to the SIL oscillator with a constant phase difference between the electrical oscillation signal and the electrical injection signal. The frequency-locked loop receives the electrical oscillation signal and produces an electrical control signal to control the phase-tracking SIL loop or the SIL oscillator for eliminating the frequency shift of the SIL oscillator caused by the phase-tracking SIL loop. Accordingly, the phase difference between the electrical oscillation signal and the electrical injection signal is maintained at 0° or 180° such that the phase-tracking SIL radar operates at optimal detection points.

13 Claims, 4 Drawing Sheets

(56) References Cited

U.S. PATENT DOCUMENTS

| | | | |
|---|---|---|---|
| 11,041,939 B2* | 6/2021 | Wang | G01S 7/352 |
| 2014/0128748 A1* | 5/2014 | Horng | G08B 13/2491 |
| | | | 600/484 |
| 2015/0015432 A1 | 1/2015 | Chang et al. | |
| 2018/0224526 A1* | 8/2018 | Wang | G01S 13/32 |
| 2018/0338730 A1* | 11/2018 | Horng | A61B 5/0507 |
| 2019/0175117 A1* | 6/2019 | Tseng | H01Q 9/0442 |
| 2019/0365244 A1* | 12/2019 | Horng | G01S 13/88 |
| 2019/0377080 A1* | 12/2019 | Wang | G01S 7/03 |
| 2020/0022656 A1* | 1/2020 | Tian | A61B 5/015 |
| 2020/0025876 A1* | 1/2020 | Chuang | G01S 13/88 |
| 2020/0295770 A1* | 9/2020 | Wang | H04L 27/22 |
| 2020/0341110 A1* | 10/2020 | Wang | G01S 13/536 |
| 2021/0302558 A1* | 9/2021 | Peng | A61B 5/0507 |
| 2021/0341595 A1* | 11/2021 | Yu | G01S 7/352 |
| 2021/0356560 A1* | 11/2021 | Wang | G01S 7/4052 |

OTHER PUBLICATIONS

Shiang-Hwua Yu et al., Highly Linear Phase-Canceling Self-Injection-Locked Ultrasonic Radar for Non-Contact Monitoring of Respiration and Heartbeat, IEEE Transactions on Biomedical Circuits and Systems, Dec. 9, 2019.

* cited by examiner

PHASE-TRACKING SELF-INJECTION-LOCKED RADAR

FIELD OF THE INVENTION

This invention generally relates to a self-injection-locked (SIL) radar, and more particularly to a phase-tracking SIL radar.

BACKGROUND OF THE INVENTION

Continuous-wave (CW) Doppler radars are widely used to monitor vital signs of people or animals. In recent years, SIL radar, one of the conventional CW Doppler radars, has received increasing attention because of its extraordinarily high sensitivity of vital sign detection. However, the conventional CW Doppler radars including the SIL radar for detecting vital signs are known to have optimal and null detection points. The optimal and null detection points occur alternatively every eighth wavelength where the maximum and minimum amplitudes of the detected vital signs are at the optimal and null detection points, respectively. Therefore, the conventional CW Doppler radars for monitoring vital signs often exhibit strong nonlinearity due to the amplitude dependence on the detected position when a target moves more than a quarter-wavelength during the monitoring period. This nonlinearity causes difficulties in tracking vital signs of the moving target with the conventional CW Doppler radars.

SUMMARY

The phase-tracking SIL radar of the present invention uses a phase-tracking SIL loop to automatically set the relative phases between the radar and the target to those of the optimal detection points, and thus can track vital signs of the moving target with high sensitivity and high linearity.

One aspect of the present invention provides a phase-tracking SIL radar including an SIL oscillator, a phase-tracking SIL loop and a frequency-locked loop. The SIL oscillator generates an electrical oscillation signal and receives an electrical injection signal related to the electrical oscillation signal for self-injection locking. The phase-tracking SIL loop receives the electrical oscillation signal from the SIL oscillator and outputs the electrical injection signal to the SIL oscillator with a constant phase difference between the electrical oscillation signal and the electrical injection signal. The frequency-locked loop receives the electrical oscillation signal from the SIL oscillator and produces an electrical control signal to control the phase-tracking SIL loop or the SIL oscillator for eliminating the frequency shift of the SIL oscillator caused by the phase-tracking SIL loop. Accordingly, the phase difference between the electrical oscillation signal and the electrical injection signal is maintained at 0° or 180° such that the phase-tracking SIL radar operates at the optimal detection points.

The phase-tracking SIL radar of the present invention differs from the conventional SIL radar by including the phase-tracking SIL loop and the frequency-locked loop to always operate at the optimal detection points. By doing so, its sensitivity and linearity are significantly improved for detection of vital signs when compared to those of the conventional SIL radar. As a result, the present invention can monitor vital signs of the target who can move more than a quarter-wavelength during the monitoring period.

DETAILED DESCRIPTION OF THE INVENTION

Figure 1:
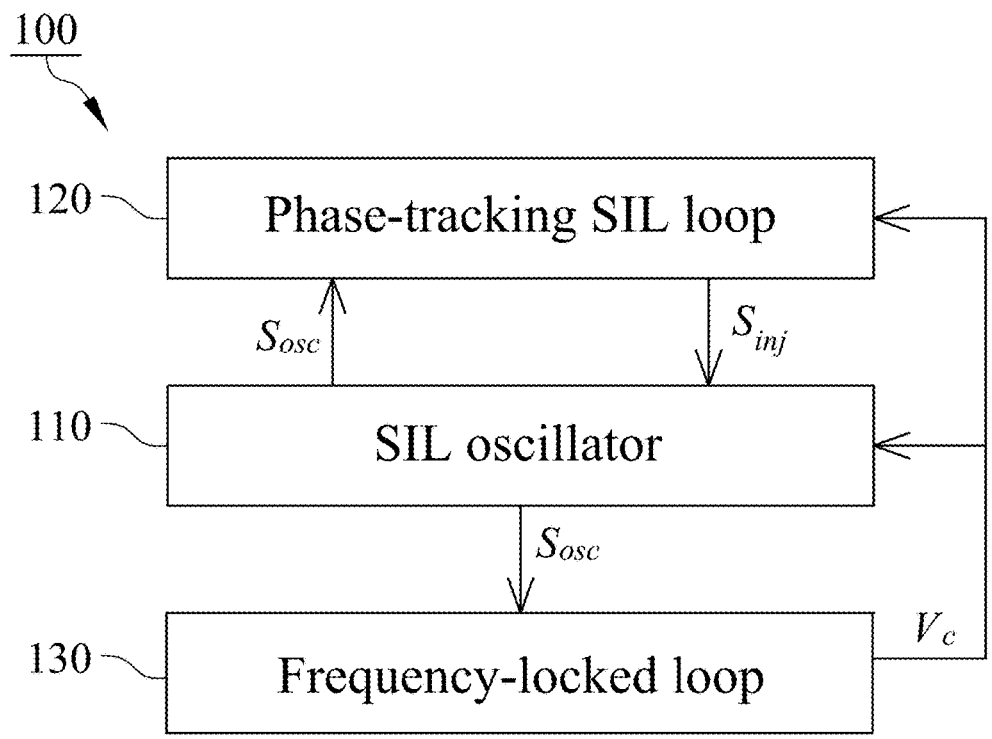
FIG. 1 is a block diagram illustrating a phase-tracking SIL radar of the present invention.

FIG. 1 is a block diagram showing a phase-tracking SIL radar 100 of the present invention. The phase-tracking SIL radar 100 includes an SIL oscillator 110, a phase-tracking SIL loop 120 and a frequency-locked loop 130. The SIL oscillator 110 generates an electrical oscillation signal $S_{osc}$ and receives an electrical injection signal $S_{inj}$ related to the electrical oscillation signal $S_{osc}$ for self-injection locking. The phase-tracking SIL loop 120 is coupled to the SIL oscillator 110 to receive the electrical oscillation signal $S_{osc}$ from the SIL oscillator 110 and output the electrical injection signal $S_{inj}$ to the SIL oscillator 110 with a constant phase difference between the electrical oscillation signal $S_{osc}$ and the electrical injection signal $S_{inj}$. The frequency-locked loop 130 is also coupled to the SIL oscillator 110 to receive and process the electrical oscillation signal $S_{osc}$ to produce an electrical control signal $V_c$ for controlling the phase-tracking SIL loop 120 or the SIL oscillator 110 to eliminate the frequency shift of the SIL oscillator 110 caused by the phase-tracking SIL loop 120. Accordingly, the phase difference between the electrical oscillation signal $S_{osc}$ and the electrical injection signal $S_{inj}$ is maintained at 0° or 180° such that the phase-tracking SIL radar 100 operates at optimal detection points.

Figure 2:
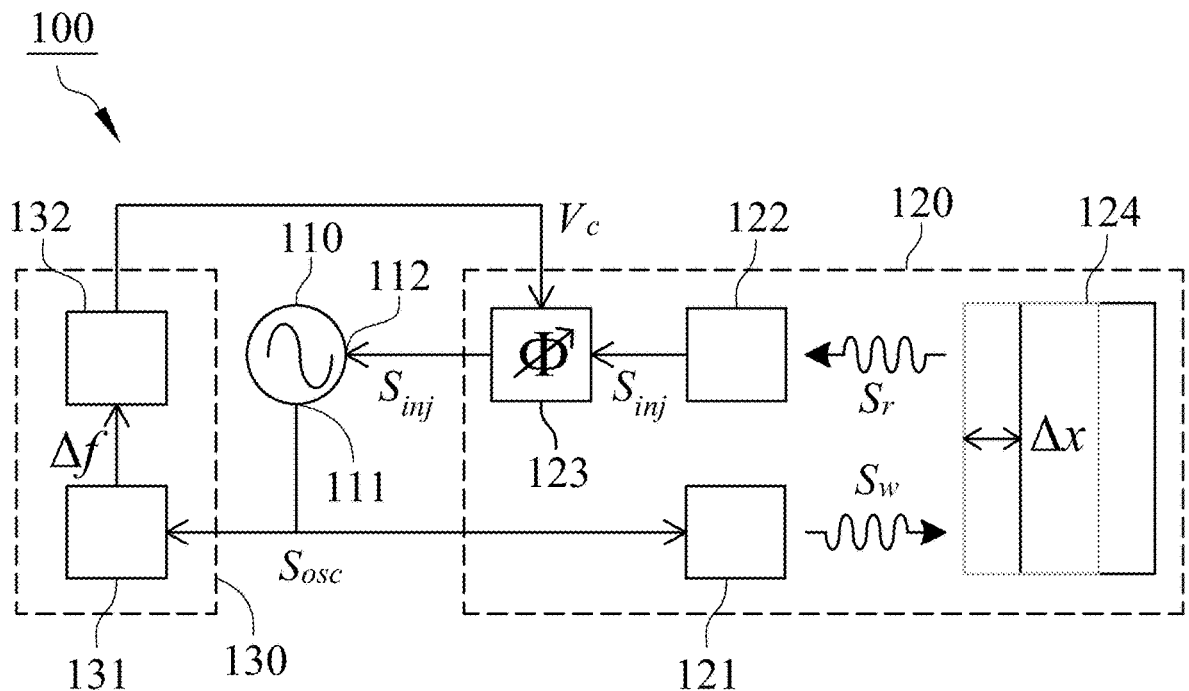
FIG. 2 is a circuit diagram illustrating a phase-tracking SIL radar in accordance with a first embodiment of the present invention.

FIG. 2 is a circuit diagram of a phase-tracking SIL radar 100 in accordance with a first embodiment of the present invention. In this embodiment, the SIL oscillator 110 has an output port 111 for delivering the electrical oscillation signal $S_{osc}$ to the phase-tracking SIL loop 120 and the frequency-locked loop 130 and an injection port 112 for receiving the electrical injection signal $S_{inj}$ from the phase-tracking SIL loop 120. The electrical injection signal $S_{inj}$ makes the SIL oscillator 110 enter an SIL state.

The phase-tracking SIL loop 120 includes a transmitter 121, a receiver 122, a phase shifter 123 and a target 124. The transmitter 121 is electrically connected to the SIL oscillator 110 to convert the electrical oscillation signal $S_{osc}$ from the SIL oscillator 110 into a wireless signal $S_w$ for transmission to the target 124. The receiver 122 is provided to convert a reflected signal $S_r$ from the target 124 into the electrical injection signal $S_{inj}$. The reflected signal $S_r$ and the wireless signal $S_w$ are in the same form of electromagnetic, acoustic or optical waves.

The phase shifter 123 is electrically connected between the receiver 122 and the SIL oscillator 110 to phase-shift the electrical injection signal $S_{inj}$ for injection into the SIL oscillator 110. Accordingly, the SIL oscillator 110 enters the SIL state. While a displacement Δx of the target 124 relative to the transmitter 121 or the receiver 122 happens, the electrical injection signal $S_{inj}$ has a Doppler phase shift as a result of the Doppler effect on the reflected signal $S_r$. Moreover, due to the phase-tracking SIL loop 120, the frequency of the SIL oscillator 110 varies with the phase difference between the electrical oscillation signal $S_{osc}$ and the electrical injection signal $S_{inj}$.

The transmitter 121 and the receiver 122 may use electromagnetic antennas, acoustic transducers or optical transceivers for conversion between electrical signals and electromagnetic waves, acoustic waves or optical waves, respectively. Additionally, the transmitter 121 and the receiver 122 may include an amplifier and a frequency converter to amplify and frequency-convert the electrical oscillation signal $S_{osc}$ and the electrical injection signal $S_{inj}$. Furthermore, the transmitter 121 and the receiver 122 may include a digital-to-analog converter (DAC) and an analog-to-digital converter (ADC) if the electrical oscillation signal $S_{osc}$ and the electrical injection signal $S_{inj}$ are digital signals.

With reference to FIG. 2, the frequency-locked loop 130 includes a frequency demodulator 131 and a controller 132. The frequency demodulator 131 is electrically connected to the SIL oscillator 110 to demodulate the electrical oscillation signal $S_{osc}$ from the SIL oscillator 110 into an electrical frequency-shift signal Δf. The controller 132 is electrically connected to the frequency demodulator 131 to produce an electrical control signal $V_c$ that depends on the electrical frequency-shift signal Δf from the frequency demodulator 131 for delivery to the phase shifter 123. The electrical control signal $V_c$ is used to control the phase shifter 123 to phase-shift the electrical injection signal $S_{inj}$ with the phase difference of 0° or 180° from the electrical oscillation signal $S_{osc}$ by eliminating the frequency shift of the SIL oscillator 110 caused by the phase-tracking SIL loop 120.

Figure 3:
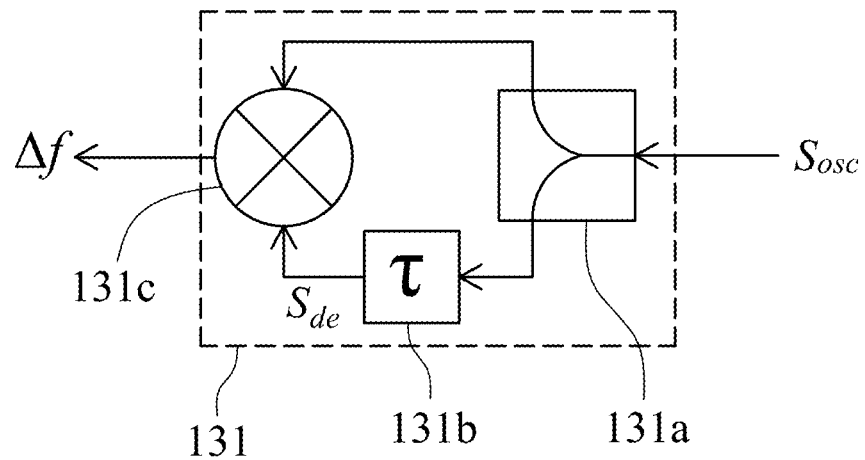
FIG. 3 is a circuit diagram illustrating a frequency demodulator in accordance with the first embodiment of the present invention.

With reference to FIG. 3, the frequency demodulator 131 in this embodiment includes a power splitter 131a, a delay unit 131b and a mixer 131c. The power splitter 131a is electrically connected to the output port 111 of the SIL oscillator 110 to split the electrical oscillation signal $S_{osc}$ from the output port 111 of the SIL oscillator 110 into two parts. The delay unit 131b is electrically connected to the power splitter 131a to delay one part of the electrical oscillation signal $S_{osc}$ from the power splitter 131a and thus outputs an electrical delayed signal $S_{de}$. The mixer 131c is electrically connected to the power splitter 131a and the delay unit 131b to mix the other part of the electrical oscillation signal $S_{osc}$ from the power splitter 131a with the electrical delayed signal $S_{de}$ from the delay unit 131b and thus produces the electrical frequency-shift signal Δf.

The relation of the electrical frequency-shift signal Δf to the displacement Δx of the target 124 is modeled by the following equation:

$$\Delta f = -f_{LR}\sin(\theta_d) = -f_{LR}\sin\left(\theta_p + \frac{4\pi(d + \Delta x)}{\lambda}\right)$$

where $f_{LR}$ is a locking range of the SIL oscillator 110, $\theta_d$ is the phase difference between the electrical oscillation signal $S_{osc}$ and the electrical injection signal $S_{inj}$, $\theta_p$ is the phase shift induced by the phase shifter 123, d is the initial distance from the transmitter 121 or the receiver 122 to the target 124, and λ is a wavelength of the wireless signal $S_w$. The above equation indicates that the phase difference between the electrical oscillation signal $S_{osc}$ and the electrical injection signal $S_{inj}$ can be set to 0° or 180° (i.e. $\theta_d=2n\pi$ or nπ, n=integer) by eliminating the frequency shift of the SIL oscillator 110 (i.e. Δf=0). Accordingly, the electrical control signal $V_c$ can be estimated in steady state as $$V_c = \frac{\Delta\theta_p}{K_\theta} = -\frac{4\pi}{K_\theta\lambda}\Delta x$$

where $\Delta\theta_p$ is a change of the phase shift induced by the phase shifter 123 and $K_\theta$ is a phase-tuning sensitivity of the phase shifter 123. The above equation indicates that the electrical control signal $V_c$ is proportional to the displacement Δx of the target 124. As the target 124 is a person or an animal, the displacement Δx contains vital signs of the target 124.

The phase shifter 123 may be placed at other positions of the phase-tracking SIL loop 120 and controlled to phase-shift the electrical injection signal $S_{inj}$ or the electrical oscillation signal $S_{osc}$ for maintaining the phase difference of 0° or 180° between both signals.

Figure 4:
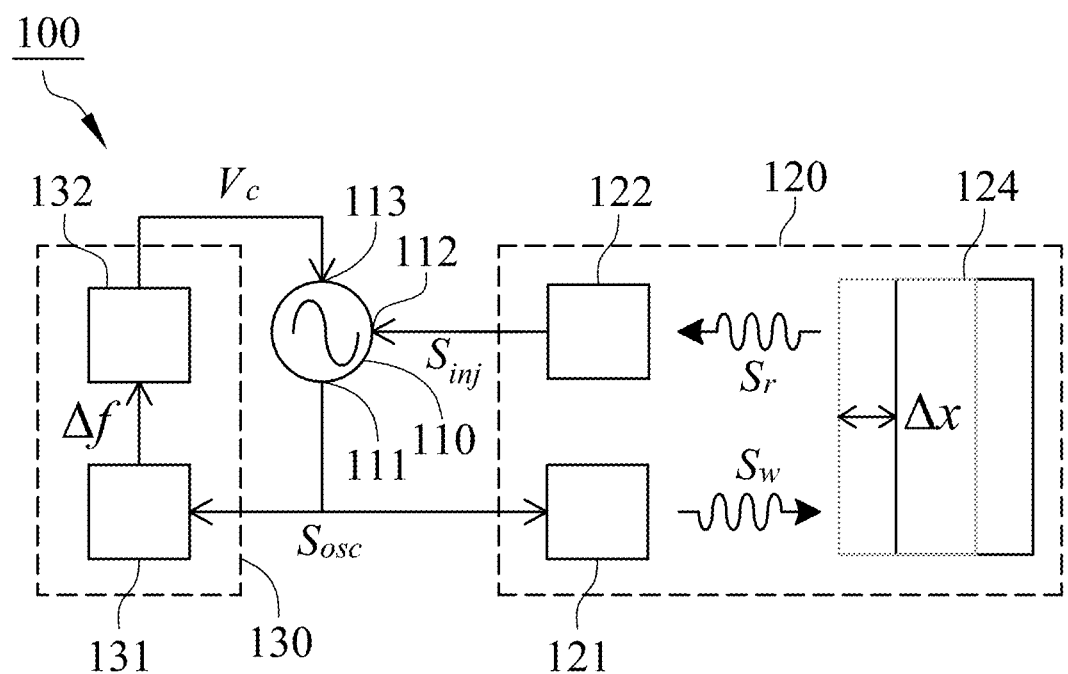
FIG. 4 is a circuit diagram illustrating a phase-tracking SIL radar in accordance with a second embodiment of the present invention.

FIG. 4 is a circuit diagram of a phase-tracking SIL radar 100 of a second embodiment of the present invention. In this embodiment, the SIL oscillator 110 further comprises a frequency control terminal 113. The phase-tracking SIL loop 120 includes the transmitter 121, the receiver 122 and the target 124, and excludes the phase shifter 123. The transmitter 121 is electrically connected to the SIL oscillator 110 to convert the electrical oscillation signal $S_{osc}$ from the SIL oscillator 110 into the wireless signal $S_w$ for transmission to the target 124. The receiver 122 converts the reflected signal $S_r$ from the target 124 into the electrical injection signal $S_{inj}$ for injection into the SIL oscillator 110.

With reference to FIG. 4, the frequency-locked loop 130 includes the frequency demodulator 131 and the controller 132. The frequency demodulator 131 is electrically connected to the SIL oscillator 110 to demodulate the electrical oscillation signal $S_{osc}$ from the SIL oscillator 110 into the electrical frequency-shift signal Δf. The controller 132 is electrically connected to the frequency demodulator 131 to produce the electrical control signal $V_c$ that depends on the electrical frequency-shift signal Δf from the frequency demodulator 131 for delivery to the frequency control terminal 113 of the SIL oscillator 110. In order to operate the phase-tracking SIL radar 100 at the optimal detection points, the electrical control signal $V_c$ controls the SIL oscillator 110 to frequency-shift the electrical oscillation signal $S_{osc}$ with the phase difference of 0° or 180° from the electrical injection signal $S_{inj}$ by cancelling the electrical frequency-shift signal Δf. Accordingly, the electrical control signal $V_c$ can be derived in steady state as $$V_c = \frac{-\Delta f}{K_v} = \pm\frac{f_0}{K_v d}\Delta x$$

where $f_0$ and $K_v$ is an initial frequency and a frequency-tuning sensitivity of the SIL oscillator 110, respectively, and the plus and minus sign corresponds to the phase difference of 0° and 180°, respectively, between the electrical oscillation signal $S_{osc}$ and the electrical injection signal $S_{inj}$. The above equation indicates that the electrical control signal $V_c$ is proportional to the displacement Δx of the target 124. As the target 124 is the person or the animal, the displacement Δx contains vital signs of the target 124.

Figure 5:
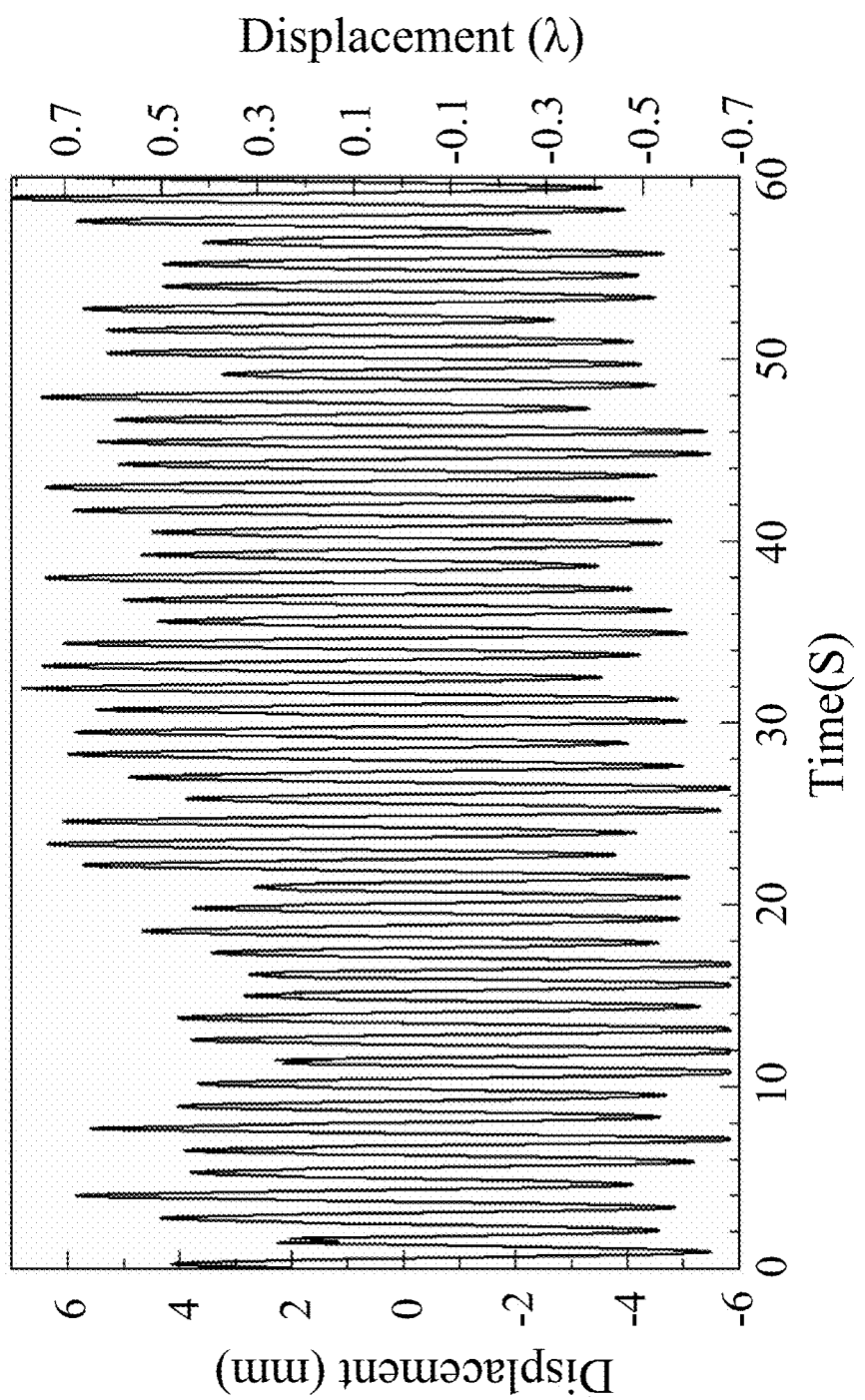
FIG. 5 shows the measured displacement of a moving target using the phase-tracking SIL radar in accordance with the first embodiment of the present invention.
Figure 6:
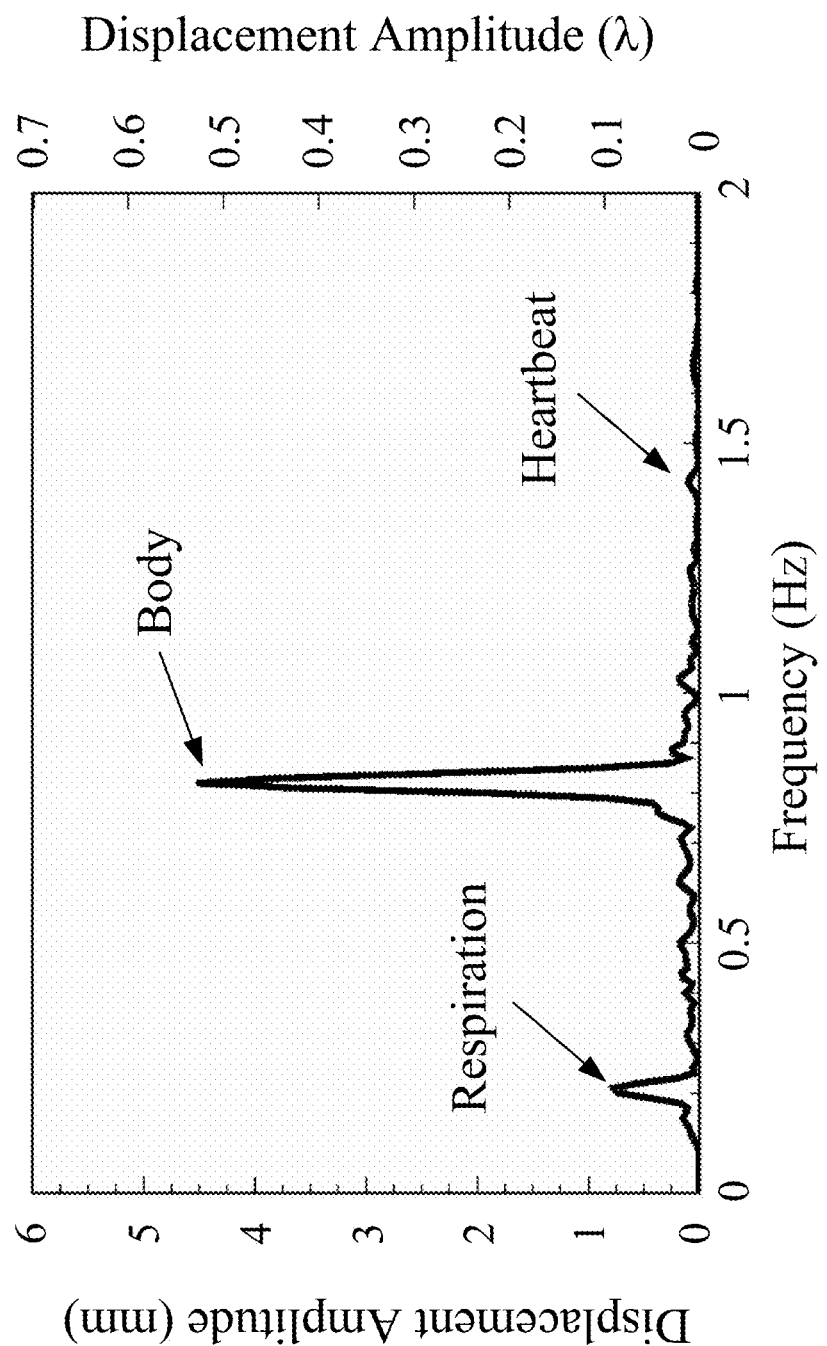
FIG. 6 shows the spectrum of the measured data of FIG. 5.

FIG. 5 shows the result of using the phase-tracking SIL radar 100 of the first embodiment to measure chest movements of a subject seated 30 cm from the radar. The wireless signal $S_w$ transmitted from the phase-tracking SIL radar 100 is an ultrasonic wave with a frequency of 40 kHz and a wavelength (λ) of 8.6 mm. The measured result shown in FIG. 5 includes the small back and forth body movements and tiny movements due to vital signs. FIG. 6 is the spectrum of the measured data presented in FIG. 6 where the arrows point at the respiratory movements, body movements and heartbeat with the frequencies of 0.21, 0.82 and 1.42 Hz, respectively. Moreover, the nonlinear artifacts caused by the body movements with an amplitude of 4.5 mm (0.52λ) are quite low so not to overwhelm the vital sign movements. This result demonstrates that the phase-tracking SIL radar 100 of the present invention can overcome the nonlinearity arising from the body movements and is therefore suitable for monitoring vital signs of the moving subject.

The phase-tracking SIL radar 100 of the present invention differs from the conventional SIL radar by including the phase-tracking SIL loop 120 and the frequency-locked loop 130 to always operate at the optimal detection points. By doing so, its sensitivity and linearity are significantly improved for detection of vital signs when compared to those of the conventional SIL radar. As a result, the present invention can monitor vital signs of the target 124 who can move more than a quarter-wavelength during the monitoring period.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A phase-tracking self-injection-locked (SIL) radar comprising:
   a self-injection-locked (SIL) oscillator configured to generate an electrical oscillation signal and receive an electrical injection signal related to the electrical oscillation signal for self-injection locking;
   a phase-tracking SIL loop coupled to the SIL oscillator and configured to receive the electrical oscillation signal from the SIL oscillator and output the electrical injection signal to the SIL oscillator with a constant phase difference between the electrical oscillation signal and the electrical injection signal; and
   a frequency-locked loop coupled to the SIL oscillator and configured to receive the electrical oscillation signal and produce an electrical control signal for delivery to the phase-tracking SIL loop or the SIL oscillator, the electrical control signal is configured to eliminate the frequency shift of the SIL oscillator caused by the phase-tracking SIL loop to maintain the constant phase difference between the electrical oscillation signal and the electrical injection signal at 0° or 180°.

2. The phase-tracking self-injection-locked radar in accordance with claim 1, wherein the phase-tracking SIL loop includes a transmitter, a receiver, a phase shifter and a target, the transmitter is electrically connected to the SIL oscillator and configured to convert the electrical oscillation signal from the SIL oscillator into a wireless signal for transmission to the target, the receiver is configured to convert a reflected signal from the target into the electrical injection signal, the phase shifter is electrically connected between the receiver and the SIL oscillator and configured to phase-shift the electrical injection signal for injection into the SIL oscillator.

3. The phase-tracking self-injection-locked radar in accordance with claim 2, wherein the transmitter and the receiver are electromagnetic antennas, acoustic transducers or optical transceivers.

4. The phase-tracking self-injection-locked radar in accordance with claim 2, wherein the frequency-locked loop includes a frequency demodulator and a controller, the frequency demodulator is electrically connected to the SIL oscillator and configured to demodulate the electrical oscillation signal from the SIL oscillator into an electrical frequency-shift signal, the controller is electrically connected to the frequency demodulator and configured to produce an electrical control signal that depends on the electrical frequency-shift signal from the frequency demodulator for delivery to the phase shifter, the electrical control signal is configured to control the phase shifter to phase-shift the electrical injection signal with the phase difference of 0° or 180° from the electrical oscillation signal by eliminating the frequency shift of the SIL oscillator caused by the phase-tracking SIL loop.

5. The phase-tracking self-injection-locked radar in accordance with claim 4, wherein the steady state relation between the electrical control signal from the controller and the electrical frequency-shift signal from the frequency demodulator is represented by an equation as follows:

$$V_c = -\frac{4\pi}{K_\theta \lambda} \Delta x$$

wherein $V_c$ denotes the electrical control signal, $K_\theta$ denotes a phase-tuning sensitivity of the phase shifter, λ denotes a wavelength of the wireless signal, $\Delta x$ is a displacement of the target.

6. The phase-tracking self-injection-locked radar in accordance with claim 2, wherein the SIL oscillator comprises an output port and an injection port, the output port is configured to deliver the electrical oscillation signal to the phase-tracking SIL loop and the frequency-locked loop, the injection port is configured to receive the electrical injection signal from the phase shifter of the phase-tracking SIL loop.

7. The phase-tracking self-injection-locked radar in accordance with claim 6, wherein the frequency demodulator includes a power splitter, a delay unit and a mixer, the power splitter is electrically connected to the output port of the SIL oscillator and configured to split the electrical oscillation signal from the output port of the SIL oscillator into two parts, the delay unit is electrically connected to the power splitter and configured to delay one part of the electrical oscillation signal from the power splitter and configured to output an electrical delayed signal, the mixer is electrically connected to the power splitter and the delay unit and configured to mix the other part of the electrical oscillation signal from the power splitter with the electrical delayed signal from the delay unit and configured to produce the electrical frequency-shift signal.

8. The phase-tracking self-injection-locked radar in accordance with claim 1, wherein the phase-tracking SIL loop includes a transmitter, a receiver and a target, the transmitter is electrically connected to the SIL oscillator and configured to convert the electrical oscillation signal from the SIL oscillator into a wireless signal for transmission to the target, the receiver is configured to convert a reflected signal from the target into the electrical injection signal for injection into the SIL oscillator.

9. The phase-tracking self-injection-locked radar in accordance with claim 8, wherein the transmitter and the receiver are electromagnetic antennas, acoustic transducers or optical transceivers.

10. The phase-tracking self-injection-locked radar in accordance with claim 8, wherein the frequency-locked loop includes a frequency demodulator and a controller, the frequency demodulator is electrically connected to the SIL oscillator and configured to demodulate the electrical oscillation signal from the SIL oscillator into an electrical frequency-shift signal, the controller is electrically connected to the frequency demodulator and configured to produce an electrical control signal that depends on the electrical frequency-shift signal from the frequency demodulator for delivery to the SIL oscillator, the electrical control signal is configured to control the SIL oscillator to frequency-shift the electrical oscillation signal with the phase difference of 0° or 180° from the electrical injection signal by eliminating the frequency shift of the SIL oscillator caused by the phase-tracking SIL loop.

11. The phase-tracking self-injection-locked radar in accordance with claim 10, wherein the steady state relation between the electrical control signal from the controller and the electrical frequency-shift signal from the frequency demodulator is represented by an equation as follows:

$$V_c = \pm \frac{f_0}{K_v d} \Delta x$$

wherein $V_c$ denotes the electrical control signal, $K_v$ denotes a frequency-tuning sensitivity of the SIL oscillator, $f_0$ denotes an initial frequency of the SIL oscillator, d is the initial distance from the transmitter or the receiver to the target, $\Delta x$ is a displacement of the target.

12. The phase-tracking self-injection-locked radar in accordance with claim 10, wherein the SIL oscillator comprises an output port, an injection port and a frequency control terminal, the output port is configured to deliver the electrical oscillation signal to the phase-tracking SIL loop and the frequency-locked loop, the injection port is configured to receive the electrical injection signal from the phase-tracking SIL loop, the frequency control terminal is configured to receive the electrical control signal from the controller.

13. The phase-tracking self-injection-locked radar in accordance with claim 12, wherein the frequency demodulator includes a power splitter, a delay unit and a mixer, the power splitter is electrically connected to the output port of the SIL oscillator and configured to delay the electrical oscillation signal from the output port of the SIL oscillator into two parts, the delay unit is electrically connected to the power splitter and configured to delay one part of the electrical oscillation signal from the power splitter and configured to output an electrical delayed signal, the mixer is electrically connected to the power splitter and the delay unit and configured to mix the other part of the electrical oscillation signal from the power splitter with the electrical delayed signal from the delay unit and configured to produce the electrical frequency-shift signal.

\* \* \* \* \*